United States Patent [19]
Young et al.

[11] Patent Number: 5,920,219
[45] Date of Patent: Jul. 6, 1999

[54] CLOCK-CONTROLLED PRECISION MONOSTABLE CIRCUIT

[75] Inventors: William R. Young, Palm Bay; Brian E. Williams, Melbourne, both of Fla.

[73] Assignee: Harris Corporation, Melbourne, Fla.

[21] Appl. No.: 08/669,066

[22] Filed: Jun. 24, 1996

[51] Int. Cl.[6] .................................................. H03K 3/284
[52] U.S. Cl. ........................................................ 327/227
[58] Field of Search .................................. 327/172, 175, 327/176, 178, 227, 228, 229, 230, 165, 166, 170

[56] References Cited

U.S. PATENT DOCUMENTS

| | | | |
|---|---|---|---|
| Re. 31,551 | 4/1984 | Bjorke | 327/227 |
| 3,904,894 | 9/1975 | Ciolli | 327/227 |
| 4,009,404 | 2/1977 | Kuo | 327/227 |
| 5,086,237 | 2/1992 | Matsumoto | 327/227 |
| 5,410,191 | 4/1995 | Miura | 327/227 |

FOREIGN PATENT DOCUMENTS

| | | | |
|---|---|---|---|
| 406132787 | 5/1994 | Japan | 327/227 |

*Primary Examiner*—My-Trang Nu Ton
*Attorney, Agent, or Firm*—Charles E. Wande

[57] ABSTRACT

A clock-controlled monostable multivibrator circuit comprises a multivibrator circuit arrangement and an associated pulse duration control circuit. The multivibrator has an input terminal to which an input signal is applied, an output terminal from which an output pulse is produced in response to the application of the input signal to the input terminal, and a control terminal. The pulse duration control circuit produces a reference parameter which is coupled to the control terminal of the multivibrator circuit arrangement. A clock signal is applied to a clock input of the pulse duration control circuit and is operative to establish the magnitude of the control parameter and thereby the duration of the output pulse produced by the multivibrator circuit arrangement.

26 Claims, 5 Drawing Sheets

CLOCK-CONTROLLED PRECISION MONOSTABLE CIRCUIT

FIELD OF THE INVENTION

The present invention relates in general to digital signal processing circuits and is particularly directed to a new and improved monostable multivibrator circuit-based pulse generator, which produces an output pulse having a duration that is controlled by a variable parameter, such as the pulse width of a precision clock signal, and is effectively insensitive to variations in circuit components of which the pulse generator is configured.

BACKGROUND OF THE INVENTION

Monostable multivibrators, or one-shots, are commonly employed by digital circuit designers to provide a pulse of finite duration. Customarily, the duration of the pulse produced by the monostable circuit is controlled by a resistance-capacitor (RC) time constant network and an associated reference or threshold voltage, and, ideally, is intended to be maintained at a prescribed value throughout the life of operation of the circuit. Unfortunately, even in circuit designs which employ precision circuit components, there is no guarantee that the characteristics of the components and voltage supply circuitry for the circuit will not undergo change, nor is there any guarantee that the operational characteristics of circuits of a predetermined design will not vary from lot to lot of a given manufacturing process.

SUMMARY OF THE INVENTION

In accordance with the present invention, the foregoing problem is effectively obviated by a monostable multivibrator circuit design, which is effectively process-independent and component-independent, relying instead upon the ability of present day electronics technology to provide extremely precise clock generator circuits (e.g., a quartz crystal-based clock generator), and configuring the monostable circuit such that its output pulse duration is essentially an exclusive function of the pulse width (or duration between successive, opposite-going transitions) of the precision clock signal.

For this purpose, the clock signal-controlled, precision monostable pulse generator circuit according to the present invention is comprised of the combination of a multivibrator circuit arrangement to which an input signal is applied, an output terminal from which an output pulse is produced in response to the input signal, and a control terminal which is coupled to receive a pulse duration control voltage generated by a precision pulse duration control circuit. The pulse duration control circuit is coupled to receive a precision clock signal, such as one supplied by quartz-crystal-based clock generator, and is operative to supply a pulse duration control voltage to the multivibrator circuit, the magnitude of the control voltage being proportional to the pulse width of the precision clock signal.

The pulse duration control circuit includes a voltage reference capacitor, which stores a charge that is iteratively adjusted by way of a digitally controlled feedback loop to a threshold comparator-based control circuit, the operation and output of which is driven by the precision clock signal. In particular, the clock signal is applied to an input flip-flop and to respective inputs of a charge-discharge gate circuit for controllably providing respective charging and discharging paths between a constant current supply circuit and the voltage reference capacitor. The charge-discharge gate circuit is further coupled to a threshold comparator-based control circuit, which is coupled to the output of the flip-flop and to the voltage reference capacitor.

The threshold comparator-based control circuit includes a storage capacitor and a charge-discharge circuit, that includes a controlled current source. This controlled current source controllably charges and discharges the storage capacitor in accordance with the logic state of the flip-flop and the voltage level of the reference voltage capacitor. A threshold comparator changes its output logic state in accordance with a predetermined relationship between the voltage across the storage capacitor and a prescribed reference voltage. The output of the threshold comparator is employed to reset the flip-flop and to control the operation of the charge-discharge gate circuit.

The voltage across the voltage reference capacitor, which represents the pulse duration control voltage, is coupled to the control input of the multivibrator circuit arrangement, in particular, to the control input of the controlled current source of a further threshold comparator-based control circuit. This further threshold comparator-based control circuit is configured identically to that of the pulse duration control circuit and includes a storage capacitor and a charge-discharge circuit that is operative to controllably charge and discharge the storage capacitor, in accordance with the logic state of the output terminal of the multivibrator circuit and the voltage level supplied from the voltage reference capacitor of the pulse duration control circuit.

The multivibrator circuit arrangement includes a digital differentiator circuit comprised of a cascaded flip-flop and logic gate, to which the signal that triggers the operation of the monostable circuit is coupled. The output of the digital differentiator circuit is coupled to an output flip-flop, the Q output of which is coupled to an output buffer circuit and to the controlled current source of the further threshold comparator-based control circuit.

The output of the threshold comparator of the further threshold comparator-based control circuit is fed back to the reset input of the output flip-flop, and is operative to control the termination of the output pulse defined by the Q output of the output flip-flop, in accordance with control voltage supplied from the voltage reference capacitor of the pulse duration control circuit.

Over multiple clock cycles, the feedback loop through the threshold comparator-based control circuit of the pulse duration control circuit is operative to bring the amount of charge stored on the voltage reference storage capacitor to a stable value that is proportional to the pulse width of the clock signal applied to the pulse duration control circuit. In response to an input signal, the differentiator triggers the output flip-flop to change state and define the leading edge of the output pulse. This leading edge of the output pulse triggers the discharge of the capacitor in the further threshold comparator-based control circuit. As the capacitor is discharged, its voltage eventually reaches the threshold reference voltage, causing the output of the further threshold comparator to change state, resetting the output flip-flop, thereby terminating the output pulse.

Since the threshold comparator-based control circuit of the monostable circuit arrangement is configured identically to the threshold comparator-based control circuit of the pulse duration control circuit (which uses the pulse width of the precision clock signal to define the magnitude of the voltage across the voltage reference capacitor), the operation of the monostable control circuit will track that of the pulse duration control circuit in accordance with the ratio of the geometries of the respective components of the two circuits. With present day semiconductor processing techniques, this ratio can be set effectively equal to 1:1, so that the two threshold comparator-based control circuits can be effectively matched, making the duration of the output pulse equal to the duration of one-half cycle (clock signal pulse width) of the clock signal.

If the clock signal has a frequency that is considerably faster than (at least and preferably greater than twice the frequency of) the input signal, it is possible to use only a single circuit to execute the function of each of the threshold comparator-based control circuit of the monostable circuit arrangement and the threshold comparator-based control circuit of the pulse duration control circuit. In this alternative embodiment, the threshold comparator-based control circuit of the monostable circuit arrangement is eliminated and the clock signal and the input signal are gated to the threshold comparator-based control circuit of the pulse duration control circuit by means of a timing control circuit, to which the input signal is applied and which is clocked by the clock signal. This timing control circuit may comprise a multistage delay line, containing a plurality of cascaded flip-flops, each of which is clocked by the clock signal. This timing control circuit is configured to produce one calibration pulse per cycle of the input signal.

The composition of the timing control circuit is a matter of design and may be configured as desired to define the number and rate of calibration pulses to be generated between transitions in the input signal. For an input signal which undergoes logic state transitions at a relatively slow rate, the number of calibration pulses may be increased to greater than one per cycle, so as to calibrate the circuit in a shorter period of time.

DETAILED DESCRIPTION

Figure 1:
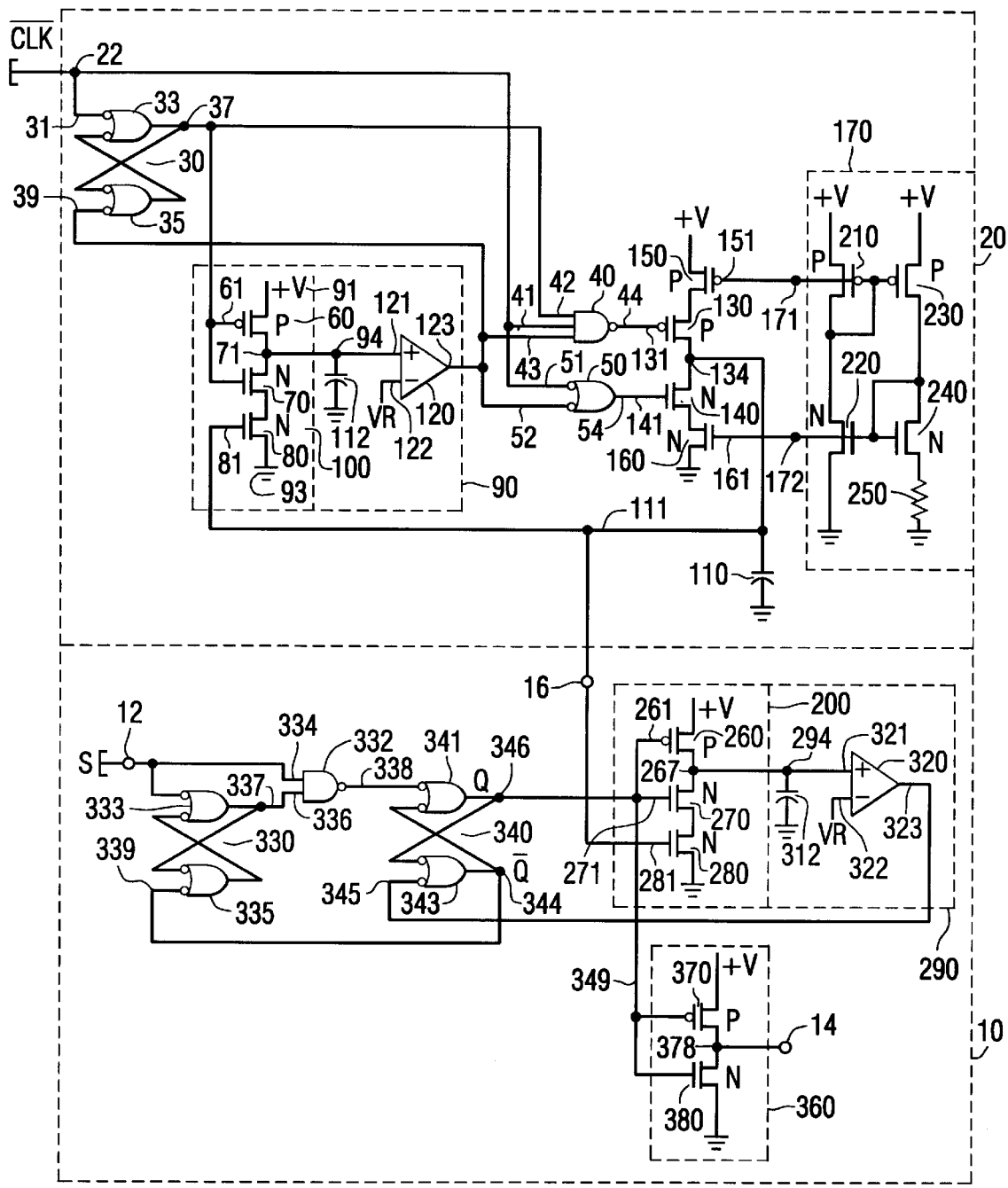
FIG. 1 schematically illustrates a clock signal-controlled, precision pulse generator circuit in accordance with the present invention.

The clock signal-controlled, precision pulse generator circuit in accordance with the present invention is schematically illustrated in FIG. 1, as comprising a multivibrator circuit arrangement 10 having an input terminal 12 to which an input signal (S) is applied, and an output terminal 14 from which an output pulse is produced in response to the application of the input signal (S) to the input terminal 12. Multivibrator circuit arrangement 10 further includes a control terminal 16, which is coupled to receive a pulse duration control voltage generated by a pulse duration control circuit 20. Pulse duration control circuit 20 has an input terminal 22, to which a clock signal CLK BAR is applied, and is operative to assert a control voltage to the control terminal 16 of multivibrator circuit 10, in accordance with the pulse width of the precision clock signal CLK BAR applied to the input terminal 22 of the pulse duration control circuit 20, as will be described.

As described above, a significant feature of each of the pulse duration control circuit 20 and monostable circuit arrangement 10 is the fact that their operation is effectively independent of variations in parameters of the components of which the circuits are configured and instead are dependent only upon the pulse width of the clock signal CLK BAR, which can be established very precisely with state of the art precision quartz crystal clock signal generator circuitry. By using precision digital control circuitry, such as a crystal-driven precision digital frequency synthesizer to tune or adjust the clock pulse width, the duration of the output pulse can be varied as desired.

Input terminal 22, to which clock signal CLK BAR is applied, is coupled to a first input 31 of flip-flop 30, comprised cross-coupled NAND gates 33 and 35, and having a set output terminal 37 and a reset input terminal 39. Input terminal 22 is further coupled to an input 41 of each NAND gate 40 and to an input 51 of NOR gate 50. The set output terminal 37 of flip-flop 30 is coupled to a second input 42 of NAND gate 40, and to gate terminals 61 and 71 of P channel FET 60 and N channel FET 70, respectively, of a first control circuit 90.

P channel FET 60, N channel FET 70, and an N channel FET 80 have their source-drain paths coupled in series between a first voltage (+V) reference terminal 91 and ground 93, and form a controlled current source 100, which is operative to controllably charge and discharge a capacitor 112, in accordance with the logic state of the flip-flop output terminal 37, and the voltage level supplied to the gate terminal 81 of N channel FET 80, via line 111 from a capacitor 110. N channel FET 80 effectively operates as a voltage-controlled, variable current source, which is operative to control the magnitude of current discharged from capacitor 112 (when N channel FET 70 is gated ON), in accordance with the voltage on voltage reference capacitor 110.

Capacitor 112 is coupled between ground 93 and a line 94, which is connected between the common drain-drain path connection 71, of P channel FET 60 and N channel FET 70, and a first (+) input terminal 121 of a threshold comparator 120. A second (−) input 122 of threshold comparator 120 is coupled to receive a prescribed reference voltage VR. Normally, the logic state at the output 123 of threshold comparator 120 is at a first logic level, e.g., high. However, in response to the voltage applied to its (+) input terminal 121 becoming less than the reference voltage VR, the logic level at voltage comparator output terminal 123 changes state (e.g., goes low).

The output 123 of threshold comparator 120 is coupled to the reset input terminal 39 of flip-flop 30, to a third input 43 of NAND gate 40 and to a second input 52 of NOR gate 50. The output 44 of NAND gate 40 is coupled to the gate terminal 131 of a P channel FET 130, while the output 54 of NOR gate 50 is coupled to the gate terminal 141 of an N channel FET 140. P channel FET 130 and N channel FET 140 have their drain-drain paths coupled in series with the source-drain paths of a P channel FET 150 and an N channel FET 160 between (+V) reference terminal 91 and ground 93.

The drain-drain connection 134 of P channel FET 130 and N channel FET 140 is connected to capacitor 110.

The gate terminal 151 of P channel FET 150 is coupled to a first output terminal 171 of a voltage insensitive current generator circuit 170, while the gate terminal 161 of N channel FET 160 is coupled to a second output terminal 172 of current generator circuit 170. Current generator circuit 170 is comprised parallel-connected, complementary channel FET pairs 210, 220 and 230, 240 having their respective common connected gates connected to the first and second output terminals 171 and 172, and their source-drain paths coupled in series between (+V) voltage reference terminal 91 and ground 93.

A resistor 250 is coupled in the source-drain path of complementary FET pair 230 and 240, and is operative to establish the magnitude of the parallel source-drain currents through current generator circuit 170, and thereby also the maximum current through the series-connected source-drain paths of P channel FET 150—P channel FET 130, and the series connected source-drain paths of N channel FET 140 and N channel FET 160.

Since the gates of P channel FET 130 and N channel 140 are connected to the outputs 44 and 54, respectively, of gate circuits 40 and 50, the drain-drain connection 134 of P channel FET 130 and N channel FET 140 serves to controllably supply current to or remove (discharge) current from capacitor 110 in accordance with the output logic states of gate circuits 40 and 50.

Line 111 from capacitor 110 is further coupled to gate terminal 281 of a current source N channel FET 280. N channel FET 280 has its source-drain path coupled in series with the source-drain paths of P channel FET 260 and N channel FET 270 between (+V) voltage terminal 91 and ground terminal 93, to form a controlled current source 200. Like N channel FET 80 in controlled current source 100, N channel FET 280 effectively operates as a voltage-controlled, variable current source, which is operative to control the magnitude of current discharged from capacitor 312 (when N channel FET 270 is gated ON), in accordance with the voltage on the voltage reference capacitor 110.

Namely, like controlled current source 100 in pulse duration control circuit 20, current source 200 is operative to controllably charge and discharge a capacitor 312 of a control circuit 290, in accordance with the logic state of the output 346 of a multivibrator circuit 340 and the voltage level supplied to the gate terminal 281 of N channel FET 280, via line 111 from capacitor 110 in pulse duration control circuit 20.

Capacitor 312 is coupled between ground 93 and a line 294, which is connected between the common drain-drain path connection 267 of P channel FET 260 and N channel FET 270, and a first (+) input terminal 321 of a threshold comparator 320. A second (−) input 322 of threshold comparator 320 is coupled to receive voltage VR. As in the threshold comparator circuit 120, described above, the logic state at the output 323 of threshold comparator 320 is normally at a first logic level, e.g., high. However, in response to the voltage applied to its (+) input terminal 321 becoming less than the reference voltage VR, the logic level at output 323 changes state (e.g., goes low). The output 323 of threshold comparator 320 is coupled to the reset terminal 345 of multivibrator circuit 340.

Multivibrator circuit arrangement 10 further includes a flip-flop 330, comprised of cross-coupled NAND gates 333 and 335, having a Q output terminal 337 and a reset input terminal 339. Input terminal 12 is coupled to NAND gate 333 and to a first input 334 of a NAND gate 332, while reset terminal 339 is coupled to NAND gate 335. The set output terminal 337 of flip-flop 330 is coupled to a second input 336 of NAND gate 332, the output 338 of which is coupled to one input of NAND gate 341 of cross-coupled NAND gates 341 and 343 of a flip-flop 340. Flip-flop 330 and NAND gate 332 form a differentiator logic circuit which is operative to produce a relatively narrow pulse that is applied to flip-flop 340 and serves to define the time of occurrence of the leading edge of the output pulse from flip-flop 340. The QBAR output 344 of flip-flop 340 is coupled to reset input terminal 339 of flip-flop 330.

The Q output 346 of flip-flop 340 is coupled via line 349 to an (inverting) output buffer 360, which isolates the circuit from the effects of an external load, comprised of P channel FET 370 and N channel FET 380 having their source-drain paths connected in series between (+V) voltage reference terminal 91 and ground terminal 93. Pulse output terminal 14 is connected to the common drain-drain connection 378 of P channel FET 370 and N channel FET 380 of output buffer 360. Output buffer may be replaced by a pulsed current source, where the current is controlled by the voltage on the reference voltage capacitor 110, and is gated by the monostable circuit 10.

Operation

The operation of the clock signal controlled pulse generator circuit of FIG. 1 will now be described with reference to the set of timing diagrams CLK BAR, 1–6, S and 7–12 of FIG. 2. As shown at timing diagram CLK BAR, each of the high and low states of the clock signal (CLK BAR) applied to clock input terminal 22 of pulse duration control circuit 10 has a 50% duty cycle, with a high-to-low transition CLK BAR-1.

In response to the high-to-low transition CLK BAR-1 of the clock signal CLK BAR at input terminal 22, the Q output 37 of flip-flop 30 transitions from a low to a high logic level, as shown at 37-1 in timing diagram 1 (the time differential between transition CLK BAR-1 and 37-1 corresponding to the propagation delay through flip-flop 30). With the high level of the Q output 37 of flip-flop 30 being applied to the gate terminal 61 of P channel FET 60 and to the gate terminal 71 of N channel FET 70, P channel FET 60, which had previously been turned ON by the low level Q output of flip-flop 30, is turned OFF, thereby decoupling capacitor 112 from its source of charging current—the (+V) voltage terminal 91, and instead provides a conductive path from capacitor 112 to the series-connected drain-source path of N channel FETs 70 and 80 to ground 93. Since the current through N channel FET 80 is controlled in accordance with the magnitude of the gate voltage derived from the charge stored on capacitor 110, series-connected N channel FETs 70 and 80 will begin discharging capacitor 112, and the voltage across capacitor 112 will decrease, as shown by voltage reduction segment 112-1 for timing diagram 2 in FIG. 2.

As capacitor 112 is discharged through N channel FETs 70 and 80, its voltage eventually reaches the threshold reference voltage VR. In the first portion of the set of timing diagrams of FIG. 2 surrounded by broken lines 500, this threshold voltage VR is shown as being reached prior to CLK BAR-2 at the change in logical state of clock signal CLK BAR. In the second portion of the set of timing diagrams of FIG. 2 surrounded by broken lines 600, this threshold voltage VR is shown as being reached subsequent to the low-to-high transition CLK-BAR-3 in the logical state of clock signal CLK BAR. Each of these conditions is described individually below.

Threshold Voltage VR Reached Prior to Clock Transition

Figure 2:
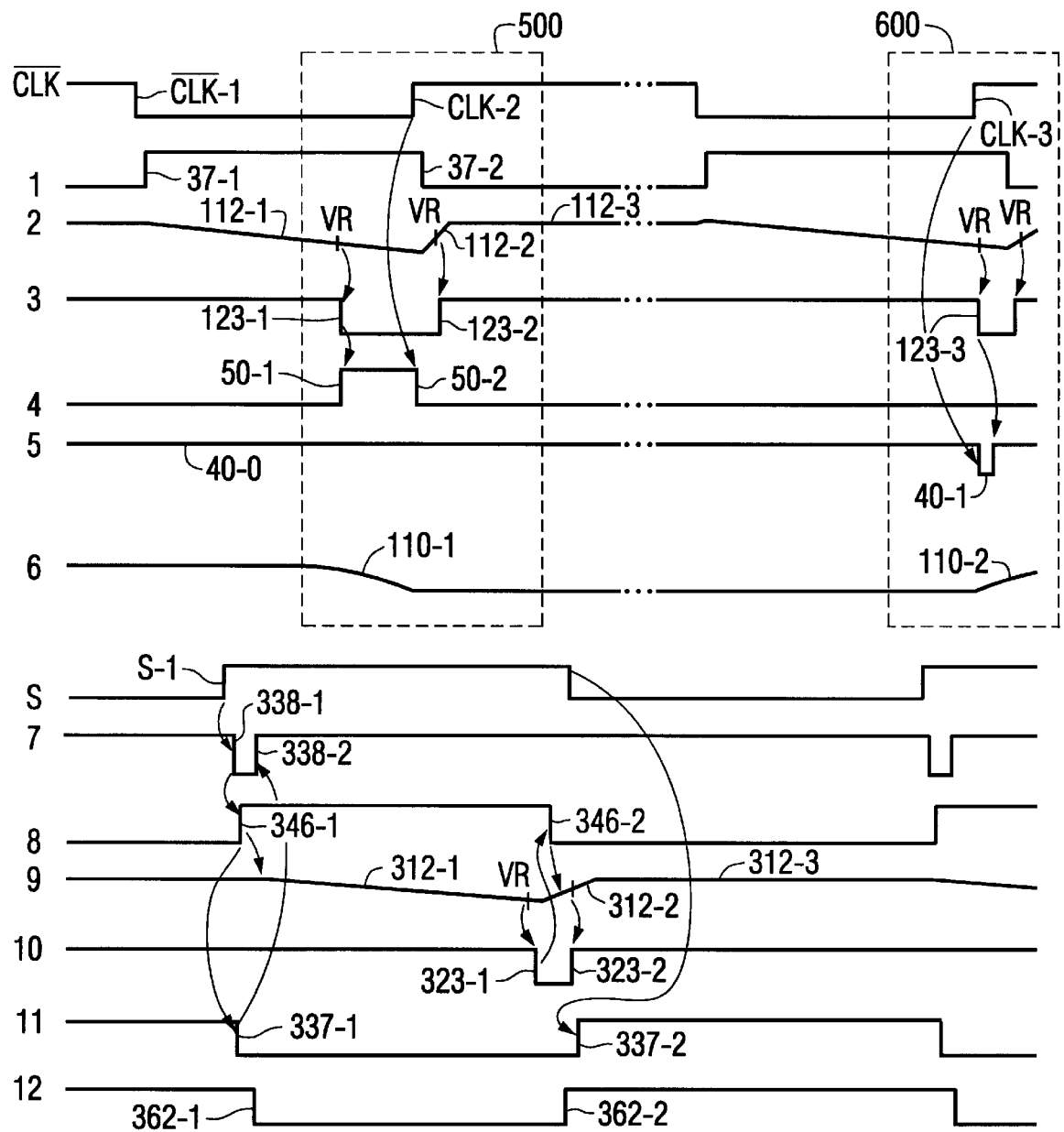
FIG. 2 is a set of timing diagrams showing the operation of the pulse generator circuit of FIG. 1, associated with various nodes of the circuit.

When the voltage on capacitor 112 reaches the threshold voltage VR, the output 123 of threshold comparator 120 changes state, transitioning from high to low, as shown at 123-1 in the timing diagram 3 of FIG. 2. Since this logic low at the output 123 of threshold comparator 120 is coupled to the reset input 39 of flip-flop 30, it changes the state to one of the inputs of the NAND gate 33 of flip-flop 30, to which the clock signal CLK BAR is applied. The logic low at the output 123 of threshold comparator 120 also causes the second input to NOR gate 50 to also become low, so that the output of NOR gate 50 goes high, as shown by the low-to-high transition 50-1 of the logic state timing diagram 4 of FIG. 2.

At this time the output of NAND gate 40 remains high, as shown at high logic level 40-0 in the timing diagram 5 of FIG. 2, thereby keeping P channel FET 130 turned OFF. With the output of NOR gate 50 going high, N channel FET 140 is gated ON, causing storage capacitor 110 to begin discharging to ground 93 through N channel FET 140 and N channel FET 160, producing the voltage variation shown at 110-1 in the timing diagram 6 of FIG. 2.

At edge CLK BAR-2, clock signal CLK BAR is shown as transitioning low-to-high, causing the output of NOR gate 50 to go low, corresponding to the high-to-low transition 50-2 in timing diagram 4, thereby gating N channel FET 140 OFF, and preventing further discharge of storage capacitor 110 through N channel FETs 140 and 160. As a result of this low-to-high clock transition, the Q output 37 of flip-flop 30 transitions from a high to a low logic level, as shown at 37-2 in the timing diagram 1. This low level gates P channel FET 60 ON and gates N channel FET 70 OFF, thereby decoupling capacitor 112 from the series-connected drain-source path of N channel FETs 70 and 80, and instead causing capacitor 112 to begin recharging through P channel FET 60, as shown by segment 112-2 in the timing diagram 2. Since the gate terminal 61 of P channel 60 FET is coupled to a hard logic low at the Q output 37 of flip-flop 30, P-channel FET 60 is turned ON hard, so that capacitor 112 will charge at a rapid rate, as shown by the steeper slope of charging segment 112-2.

As capacitor 112 is recharged through P-channel FET 60, its voltage eventually reaches the threshold reference voltage VR, whereupon the output 123 of threshold comparator 120 again changes state, transitioning from its current low logic level to its original high logic level, as shown at 123-2 in the timing diagram 3 of FIG. 2. Capacitor 112 continues to charge to its fully charged logic level, as shown at 112-3 in timing diagram 2. The logical high at the output 123 of threshold comparator 120 is coupled to the reset input 39 of flip-flop 30, which removes the reset from one of the inputs of NAND gate 35 of flip-flop 30.

Threshold Voltage Reached Subsequent to Clock Transition

Clock signal CLK BAR is shown as transitioning from low to high (transition CLK BAR-3 in timing diagram CLK BAR), which causes the output of NAND gate 40 to go low, as shown by the high-to-low transition 40-1 in timing diagram 5, thereby gating P channel FET 130 ON, and charging storage capacitor 110. When the variation in the voltage on capacitor 112 reaches the threshold voltage VR, the output 123 of threshold comparator 120 changes state, transitioning from high to low, as shown at 123-3. Since the clock signal CLK BAR has already changed state (from low to high at transition CLK BAR-3), the logic low at the output 123 of threshold comparator 120 will not cause a change in state in the output of NOR gate 50, which stays low, as shown by the high logic level of the complementary logic state timing diagram 4 of FIG. 2. However, the high-to-low change in state of the output 123 of threshold comparator will turn NAND gate 40 OFF, thereby gating P channel FET 130 OFF, and terminating the charging of storage capacitor 110, so as to produce the associated voltage variation across storage capacitor 110, shown at 110-2 in the timing diagram 6 of FIG. 2.

As described earlier, the magnitude of the voltage on storage capacitor 110 controls the conductivity of N channel FET 80 and thereby the rate at which current is discharged from capacitor 112. Since the clock signal CLK BAR changes state periodically, and provides a periodic reference for controlling the operation of threshold comparator 120, the point in time that the output 123 of threshold comparator 120 changes state will be governed by the voltage across reference storage capacitor 110.

Namely, the larger the amount of charge stored on reference storage capacitor 110, the larger the gate voltage applied to N channel FET 80 and the more rapid the discharge of storage capacitor 112, which tends to reduce the amount of time required for the voltage on storage capacitor 112 to reach the reference voltage VR of threshold comparator 120. Conversely, the smaller the amount of charge stored on reference storage capacitor 110, the smaller the gate voltage applied to N channel FET 80, reducing the discharge current from storage capacitor 112, which tends to increase the amount of time required for the voltage on storage capacitor 112 to reach the reference voltage VR of threshold comparator 120.

As a consequence, over multiple clock cycles, the pulse duration circuit 20 operates to bring the amount of charge stored on reference storage capacitor 110 to a stable value, such that the length of time required to discharge capacitor 112 from its fully charged value to the reference value VR is exactly equal to the duration of one-half a clock cycle (namely, between successive opposite-going transitions of the clock signal). In the timing diagrams of FIG. 2, this means that the point in time that capacitor 112 is discharged by current source FET 80 to the value VR coincides with edge 37-2 of the output of flip-flop 30.

Namely, once the circuit has stabilized, the time at which discharge voltage reduction segment 112-1 in timing diagram 2 reaches the threshold reference VR will be coincident with high-to-low edge 37-2 of the output of flip-flop 30 (which tracks the clock signal CLK BAR), thereby making the voltage across voltage reference capacitor 110 proportional to the pulse width of the controlling clock signal. As detailed below in connection with the description of the operation of multivibrator circuit arrangement 10, this clock signal pulse width-dependent reference voltage serves as a precision control voltage for setting the pulse duration of the output of the monostable multivibrator 10.

Monostable Circuit Operation

The operation of the multivibrator circuit arrangement 10 may be understood by reference to the timing diagrams S and 7–12. As shown at timing diagram S, an input signal having a low-to-high transition S-1 is applied to the input terminal 12. In response to the low-to-high transition of the input signal S, the output 338 of NAND gate 332 transitions from a high to a low logic level, as shown at 338-1 in timing diagram 7, which causes the Q output 346 of flip-flop 340 to transition from a low to a high logic level, as shown at 346-1 in timing diagram 8. With the reset output 344 of flip-flop 340 changing state (going low) and being fed back to the reset input 339 of flip-flop 330, the Q output 337 of flip-flop 330 undergoes a high-to-low transition, as shown at 337-1 in timing diagram 11. This high-to-low transition 337-1 changes the output state of NAND gate 332 back to a high logic level as shown at 338-2, in timing diagram 7. Namely, as described previously, the combination of flip-flop 330 and NAND gate 332 effectively operates as a differentiator, to produce the high-to-low transitioning edge 338-1 that is applied to flip-flop 340 and serves to define the time of occurrence of the leading edge of the output pulse at output terminal 14 of buffer 360, shown at 362-1 in timing diagram 12.

As in the pulse duration control circuit 20, described above, the Q output 346 of flip-flop 340 of the multivibrator circuit arrangement 10 is applied to the gate 261 of P channel FET 260 and to the gate terminal 271 of N channel FET 270, so that P channel FET 260, which had previously been turned ON by the low level Q output 346 flip-flop 340, is turned OFF, thereby decoupling capacitor 312 from its source of charging current (the +V voltage terminal 91), and instead provides a conductive path from capacitor 312 to the series-connected drain-source path of N channel FETs 270 and 280 to ground 93. Since the current through N channel FET 280 is controlled in accordance with the magnitude of the voltage applied to its gate 281 as derived from the charge stored on capacitor 110, series-connected N channel FETs 270 and 280 begin discharging capacitor 312, and the voltage across capacitor 312 will decrease, as shown by voltage reduction segment 312-1 for timing diagram 9.

As capacitor 312 is discharged through N channel FETs 270 and 280, its voltage eventually reaches the threshold reference voltage VR. When the voltage on capacitor 312 reaches the threshold voltage VR, the 323 output of threshold comparator 320 changes state, transitioning from high to low, as shown at 323-1 in the timing diagram 10. Since this logical low at the output 323 of threshold comparator 320 is coupled to the reset input 345 of flip-flop 340, the state of the Q output 346 of flip-flop 340, changes state, as shown by high-to-low transition 346-2 in timing diagram 8. This high-to-low transition 346-2 at the output of flip-flop 340 is inverted by buffer 360 to produce low-to-high output signal edge, shown at 362-2 in timing diagram 12, at output terminal 14.

This high-to-low change in state 346-2 of the Q output 346 of flip-flop 340, reverses the gate voltage applied to P channel FET 260 and N channel FET 270, thereby decoupling capacitor 312 from the series-connected drain-source path of N channel FETs 270 and 280, and instead causing capacitor 312 to begin recharging through P channel FET 260, as shown by segment 312-2 in the timing diagram 9. Since the gate terminal 261 of P channel 260 FET is coupled to a hard logic low at the Q output 346 of flip-flop 340, P-channel FET 260 is turned ON hard, charging segment 312-2 of timing diagram 9 is relatively steep, so that capacitor 312 will charge at a rapid rate.

As capacitor 312 is recharged through P-channel FET 260, its voltage eventually reaches the threshold reference voltage VR, whereupon the output 323 of threshold comparator 320 again changes state, transitioning from its low logic level back to its original high logic level, as shown by 323-2 in the timing diagram 10. Capacitor 312 continues to be charged up to its fully charged logic level, as shown at 312-3 in timing diagram 9. The logic high at the output 323 of threshold comparator 320 is coupled to the reset input 345 of flip-flop 340, which causes the output 344 to change state. Signal S transitioning from logic high to low changes the Q output 337 of flip-flop 330 from a logic low to a logic high, as shown at 337-2 in timing diagram 11.

As described previously, the circuit of FIG. 1 takes advantage of the ability to effectively match the parameters of the components of each of the control circuits 90 and 290, which enables the operation of control circuit 290 to track that of control circuit 90 (in accordance with the ratio of the geometries of the respective components of the two circuits (typically 1:1). Namely, the threshold comparator-based control circuit 290 of the monostable circuit arrangement 10 is configured identically to the threshold comparator-based control circuit 90 of the pulse duration control circuit 20.

Since, over multiple clock cycles, the feedback loop through control circuit 90 will set the voltage across capacitor 110 at a value that causes threshold detector 120 to change state in accordance with the pulse width of the precision clock signal CLK BAR, the operation of the control circuit 290 will track that of control circuit 90 in accordance with the ratio of the geometries of the respective components of the two circuits, whereby the duration of the output pulse of the monostable circuit 10 can be made equal to exactly the duration of one-half cycle of the clock signal that drives the pulse duration control circuit 20.

As described previously, since the operation of each of pulse duration control circuit 20 and monostable circuit arrangement 10 is effectively independent of variations in parameters of the components of the circuits and dependent only upon the pulse width of the precision clock signal CLK BAR. This feature of the invention makes it readily useable with precision digital control circuitry, such as a crystal-driven precision digital frequency synthesizer to tune or adjust the clock signal pulse width, so that the duration of the output pulse can be varied as desired.

In the circuit shown in FIG. 1, each of capacitors 112 and 312 is referenced to ground and is charged to the supply voltage +V. As a result, the amount of time required for each capacitor to discharge to the reference voltage value VR is a function of the difference between the voltages +V and VR. Therefore, if VR is not referenced to the supply voltage (+V), any variation in the supply voltage will change the difference between +V and VR, introducing an inaccuracy into the operation of the circuit. To avoid this potential problem, the ground side of the capacitors and the reference voltage VR for each threshold comparator should be referenced to the same supply voltage (+V). Any supply voltage fluctuation (supply noise) will now be common mode noise, which is readily minimized by employing differential comparators, making the operation of the circuit independent of variations in the supply voltage.

Figure 3:
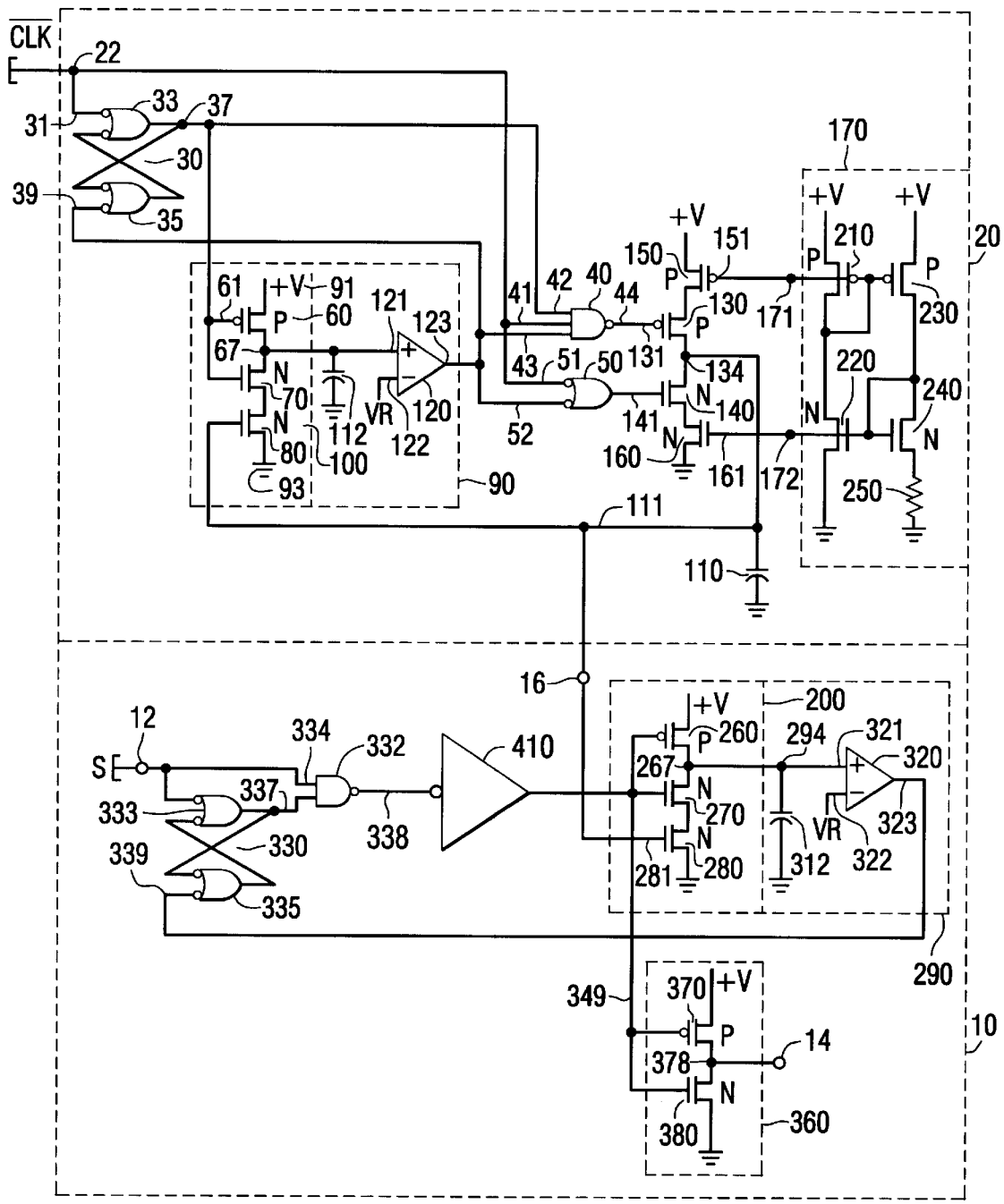
FIG. 3 shows a half-shot circuit architecture employing the clock pulse width-based, pulse duration control mechanism of the circuit architecture of FIG. 1.

The clock pulse width-based pulse duration control mechanism described above may also be employed for a half-shot circuit architecture, wherein, as shown in FIG. 3, the output flip-flop 340 is replaced by an inverter 410, and the output 323 from threshold comparator 320 is coupled to the reset terminal 339 of NAND gate 335 of flip-flop 330. The resulting circuit operates identically to the circuit of FIG. 1, so long as the input signal S does not change state (transition high-to-low) prior to capacitor 312 discharging to the reference voltage VR. However, if the input signal S transitions high-to-low prior to capacitor 312 discharging to the reference voltage VR, the output pulse immediately changes state with this transition.

Figure 4:
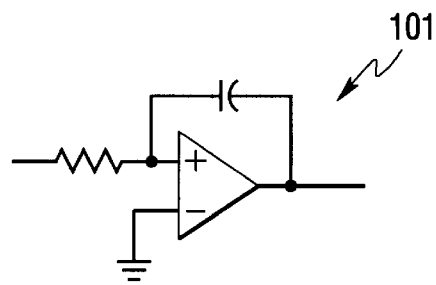
FIG. 4 schematically illustrates a linear integrator which may be employed in place of integration component inputs to the threshold comparators of the control circuits of FIG. 1.

It should also be noted that the integration component inputs to the threshold comparators of the control circuits 90 and 290 shown in FIG. 1 may be replaced by a conventional linear integrator 101 schematically illustrated in FIG. 4, which will cause the voltage associated with the charge stored on voltage reference capacitor 110 to be a linear function of the pulse width of the precision clock signal CLK BAR. In addition, errors in the operation of threshold comparators 120 and 320 resulting from their input offsets can be reduced by using voltage clamping comparators, with the voltage clamp cycle performed upon completion of the timing cycle of the monostable circuit.

Although the embodiment shown in FIG. 1 employs a pair of control circuits, comprised of control circuit 90 in the pulse duration control circuit 20 and control circuit 290 in the monostable circuit 10, if the clock signal CLK BAR has a frequency that is considerably faster than the frequency of the input signal S, it is possible to use only a single circuit to execute the function of each of control circuits 90 and 290. In such an alternative embodiment, diagrammatically shown in FIG. 5, the circuit 290 of FIG. 1 is eliminated and the clock signal CLK BAR and the input signal S are gated to the pulse duration control circuit 90 by a timing control circuit 400.

Figure 5:
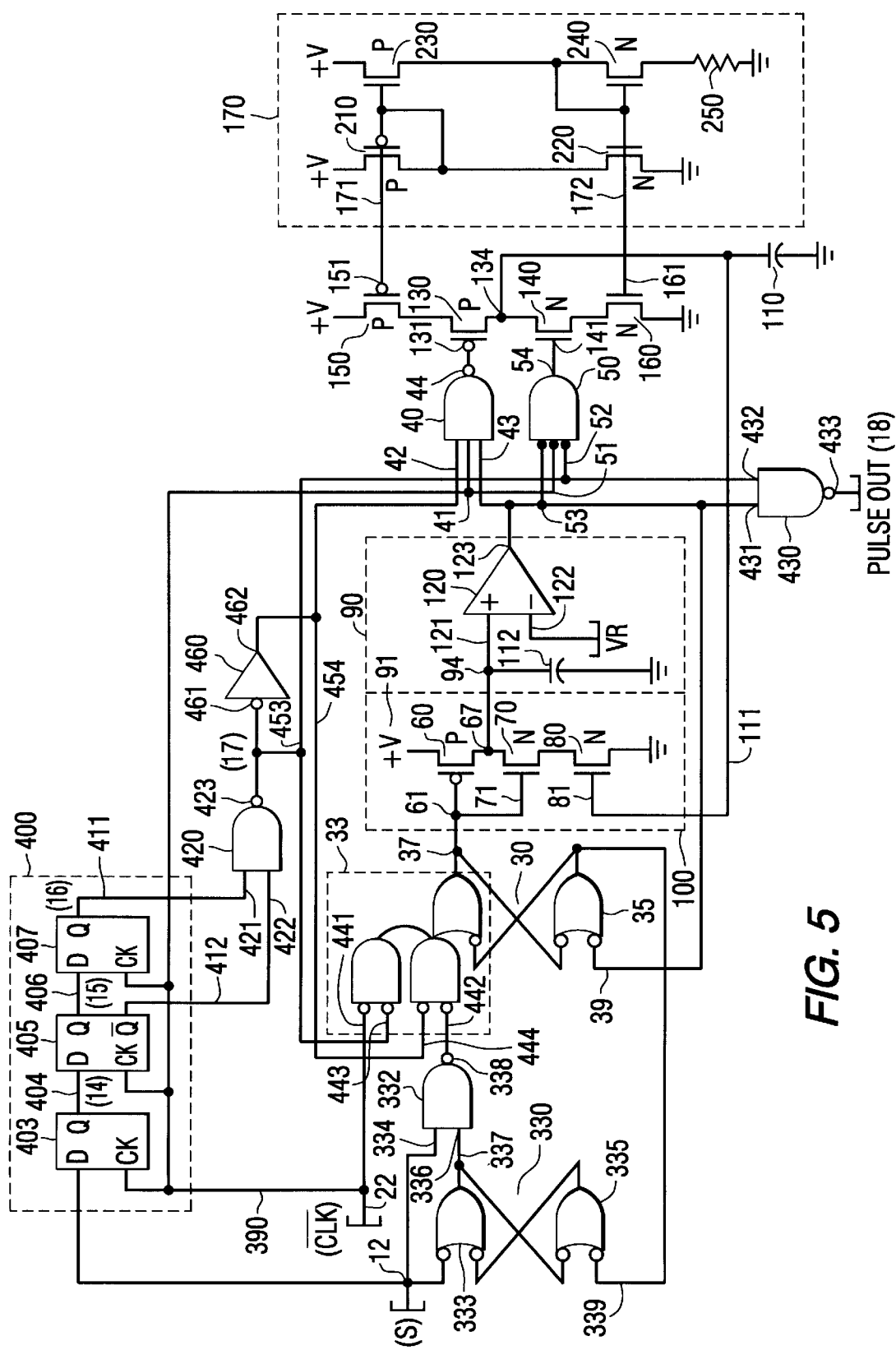
FIG. 5 schematically illustrates an alternative 'single circuit' embodiment of a clock signal-controlled, precision pulse generator circuit of the present invention.

More particularly, in the embodiment of FIG. 5, just as in the embodiment of FIG. 1, the clock signal CLK BAR is applied to input terminal 22, which is coupled to a link 390. Link 390 is coupled to a first input 441 of a two input NOR portion of compound gate 33, the output of which is the first output 37 of flip-flop 30. Link 390 is further coupled to an input 41 of NAND gate 40 and to an input 51 of NOR GATE 50. The set output terminal 37 of flip-flop 30 is coupled to respective gate terminals 61 and 71 of P channel FET 60 and N channel FET 70 within control circuit 90.

Also, P channel FET 60, N channel FET 70, and an N channel FET 80 have their source-drain paths coupled in series between a first voltage (+V) reference terminal 91 and ground 93, and form a controlled current source 100, which is operative to controllably charge and discharge a capacitor 112, in accordance with the logic state of the output terminal 37 of flip-flop 30, and the voltage level supplied to the gate terminal 81 of N channel FET 80, via line 111 from a capacitor 110.

As noted previously, N channel FET 80 effectively operates as a voltage-controlled, variable current source, to control the magnitude of current discharged from capacitor 112 (when N channel FET 70 is gated ON), in accordance with the voltage on voltage reference capacitor 110. Capacitor 112 is coupled between ground 93 and a line 94, which is connected between the common drain-drain path connection 67 of P channel FET 60 and N channel FET 70, and a first (+) input terminal 121 of threshold comparator 120. The second (−) input 122 of threshold comparator 120 is coupled to receive reference voltage VR. The logic state at the output 123 of threshold comparator 120 is normally at a first logic level, e.g., high. However, in response to the voltage applied to its (+) input terminal 121 becoming less than the reference voltage VR, the logic level at output terminal 123 changes state (e.g., goes low).

The output 123 of threshold comparator 120 is coupled to the reset input terminal 39 of flip-flop 30, to input 43 of NAND gate 40, to input 53 of NOR gate 50, and to a first input 431 of output NAND gate 430, from the output 433 of which the desired output pulse is derived. The output 44 of NAND gate 40 is coupled to the gate terminal 131 of P channel FET 130, while the output 54 of NOR gate 50 is coupled to the gate terminal 141 of N channel FET 140. Namely, the output pulse duration of the monostable circuit is established in accordance with the duration between successive, opposite-going transitions of the precision clock signal. As in FIG. 1, P channel FET 130 and N channel FET 140 have their source-drain paths coupled in series with the source-drain paths of P channel FET 150 and N channel FET 160 between (+V) reference terminal 91 and ground 93, and the drain-drain connection 134 of P channel FET 130 and N channel FET 140 is connected to capacitor 110. The gate terminal 151 of P channel FET 150 is coupled to the first output terminal 171 of the current generator circuit 170, while the gate terminal 161 of N channel FET 160 is coupled to the second output terminal 172 of current generator circuit 170.

As described supra, since the gates of P channel FET 130 and N channel 140 are connected to the outputs 44 and 54, respectively, of gate circuits 40 and 50, the drain-drain connection 134 of P channel FET 130 and N channel FET 140 controllably supplies current to or removes (discharges) current from capacitor 110 in accordance with the output logic states of gate circuits 40 and 50.

The shared multivibrator circuit arrangement of the embodiment of FIG. 5 further includes the flip-flop 330 of the embodiment of FIG. 1, comprised of cross-coupled NAND gates 333 and 335, having a Q output terminal 337 and a reset input terminal 339. Input terminal 12 is coupled to NAND gate 333 and to a first input 334 of a NAND gate 332, while reset terminal 339 is coupled to NAND gate 335. The set output terminal 337 of flip-flop 330 is coupled to a second input 336 of NAND gate 332.

In the embodiment of FIG. 5, the output 338 of NAND gate 332 is coupled to a first input 442 of a second two-input NOR portion of compound gate 33, the output of which is the first output 37 of flip-flop 30. The second input 443 to the first two-input NOR portion of compound gate 33 is coupled via a line 453 to an output 423 of NAND gate 420, to the input 461 of inverter 460, to an input 52 of NOR gate 50, and to a second input 432 of output NAND gate 430. The second input 444 to the second two-input NOR portion of compound gate 33 is coupled via a line 454 to an output 462 of an inverter 460, and to an input 42 of NAND gate 40. Inverter 460 serves to invert the output of NAND gate 420, so that the states of lines 453 and 454 are complementary.

NAND gate 420 has first and second inputs 421 and 422 thereof coupled to receive control inputs from selected outputs of a control circuit 400. For purposes of providing a non-limiting example, control circuit 400 is shown as being configured of a plurality of cascaded flip-flops 403, 405 and 407, each of which is clocked by the CLK BAR signal on line 390. The D input of flip-flop 403 is coupled to receive the S signal waveform applied to input terminal 12. The Q output of flip-flop 407 is coupled over line 411 to the first input 421 of NAND gate 420. The Q BAR output of flip-flop 405 is coupled over line 412 to the second input 422 of NAND gate 420. As will be described, in the configuration shown, the control circuit 400 will produce one calibration pulse (at the output of gate 420) per cycle of the input signal S.

It should be observed, however, that the composition of control circuit 400 is a matter of design and may be configured as desired to define the number and rate of calibration pulses to be generated between transitions in the input signal S. For an input signal S which undergoes logic state transitions at a relatively slow rate, the number of calibration pulses may be increased to greater than one per cycle, so as to calibrate the circuit in a shorter period of time.

Figure 6:
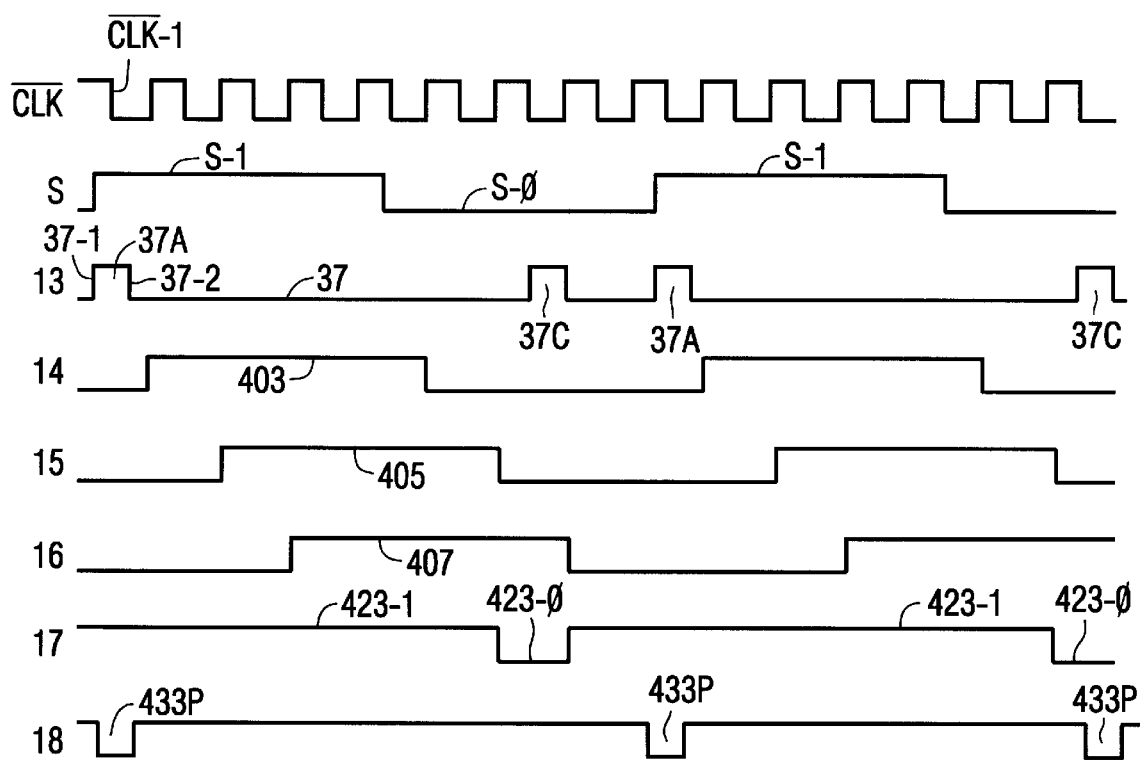
FIG. 6 is a set of timing diagrams showing the operation of the pulse generator circuit of FIG. 5, associated with various nodes of the circuit.

The operation of the clock signal controlled pulse generator circuit of FIG. 5 may be understood with reference to the set of timing diagrams CLK BAR, S, and 13–18 of FIG. 6. As shown for the clock signal CLK BAR, each of the high and low states of the clock signal (CLK BAR) applied to clock input terminal 22 of pulse duration control circuit 10 has a 50% duty cycle, and a frequency that is considerably higher than the frequency of the input signal S.

As successive ones of the clock signal CLK BAR are applied to clock input terminal 22, the logic state of the signal S is sequentially clocked through the cascaded flip-flops 403-405-407 of control circuit 400. During the high (or logical '1') state of the input signal, shown at S-1, successive '1's are clocked through the successive flip-flop stages of control circuit 400 in synchronization with the clock signals CLK BAR, which clocks each flip-flop stage of the control circuit 400. Likewise, during the low (or logical '0') state of the input signal, shown at S-0 successive '0's are clocked through the successive flip-flop stages of control circuit 400 in synchronization with the clock signals CLK BAR. Namely, the timing control circuit 400 acts as a digital delay line for the input signal S, as shown by the states of respective stages 403, 405 and 407 in FIG. 6. For the first clock signal shown in FIG. 6, the Q output 37 of flip-flop 30 produces an adjustment pulse 37A, which controls the operation of the monostable multivibrator, as described above with reference to FIGS. 1 and 2. In addition, the output 433 of NAND gate 430 produces the desired output pulse, shown at 433P.

Eventually, the respective states of the Q BAR output of flip-flop 405 on line 412 and the Q output of flip-flop 407 on line 411 will cause the output of NAND gate 420 to change state and transition low, as shown at 423-0 in FIG. 6. The output 423 of NAND gate 420 is applied to input 443 of compound gate 33 and its complement on line 454, produced by the output 462 of inverter 460, is applied over line 454 as another input 444 of compound gate 33. As a result, during the low state S-0 of the input signal and at the next high-to-low transition of the CLK BAR signal, the output of flip-flop 30 will change state for one clock cycle, producing a calibration pulse as shown at 37-C.

When the logic state of the input signal S changes from its low state S-0 to its high state S-1, the sequence described above is repeated, with the Q output 37 of flip-flop 30 producing a further adjustment pulse 37A, and the output 433 of NAND gate 430 producing the desired output pulse, shown at 433P. Subsequently, as the input signal S propagates through the control circuit, under the control of the clock signal CLK BAR, the respective states of the Q BAR output of flip-flop 405 on line 412 and the Q output of flip-flop 407 on line 411 will again cause the output of NAND gate 420 to change state and transition low, so that the output of flip-flop 30 will again change state for one clock cycle, producing a further calibration pulse 37-C, etc.

Thus, in the shared or combined embodiment of FIG. 5, with the clock signal CLK BAR having a frequency that is considerably faster than the frequency of the input signal S, the control circuit 90 is used to execute the function of each of the control circuits 90 and 290 of the embodiment of FIG. 1, with the signal CLK BAR and the input signal S being gated to the pulse duration control circuit 90 by the timing control circuit 400. By a considerably faster clock signal is meant one that is at least twice the frequency of the input signal S, and preferably greater than twice this frequency.

As will be appreciated from the foregoing description, the inability of conventional monostable circuit designs employing precision circuit components to provide a repeatable and stable duration output pulse is effectively obviated in accordance with the present invention, by combining a precision clock-controlled pulse duration control circuit with a monostable circuit, such that the duration of the output pulse generated by the monostable circuit is essentially an exclusive function of the pulse width of the controlling precision clock signal, and is effectively independent of the absolute values of the circuit's components.

While we have shown and described several embodiments in accordance with the present invention, it is to be understood that the same is not limited thereto but is susceptible to numerous changes and modifications as known to a person skilled in the art, and we therefore do not wish to be limited to the details shown and described herein, but intend to cover all such changes and modifications as are obvious to one of ordinary skill in the art.

For example, in the control circuits 90 and/or 290 of the above described embodiments, rather than fix the values of the storage capacitor and the reference voltage for the threshold comparator, and varying the charging/discharging current, the values of each of the reference voltage and the charging/discharging current may be fixed and the capacitance of the storage capacitor varied as the control parameter. Conversely, the values of each of the storage capacitor and charging/discharging current may be fixed and the reference voltage to the threshold comparator varied as the control parameter.

For either of these alternative schemes, the effect of the resulting clock-controlled pulse duration control circuit remains the same—the duration of the output pulse generated by the monostable circuit is essentially an exclusive function of the pulse width of the controlling precision clock signal, and is effectively independent of the absolute values of the circuit's components.

What is claimed:

1. A circuit for generating a pulse comprising:
   an input terminal to which an input signal is applied;
   a clock terminal to which a clock signal is applied;
   an output terminal from which said pulse is produced;
   a multivibrator circuit having an input coupled to said input terminal, and an output coupled to said output terminal, and a control terminal to which a control signal is applied, said a multivibrator circuit being operative to generate said pulse in response to said input signal and having a duration defined by said control signal; and
   a pulse duration control circuit having a clock input coupled to said clock terminal, and an output coupled to said control terminal of said multivibrator circuit, and being operative to generate said control signal in accordance with the duration between successive, opposite-going transitions of said clock signal, and causing said pulse generated by said multivibrator circuit to have a duration established in accordance with the duration between said successive, opposite-going transitions of said clock signal.

2. A circuit according to claim 1, wherein said pulse duration control circuit includes a parameter reference circuit, which is operative to generate a reference parameter in accordance with said clock signal, and wherein said pulse duration control circuit is operative to establish the duration of said control signal and thereby the duration of said pulse generated by said multivibrator circuit in accordance with said reference parameter.

3. A circuit according to claim 2, further including a reference parameter adjustment circuit which is operative to adjust said reference parameter between transitions in said input signal.

4. A circuit according to claim 3, wherein said parameter reference circuit is operative to generate a reference voltage in accordance with said duration between successive, opposite-going transitions of said clock signal and changes in state of the output of a first threshold comparator having an input which is defined in accordance with said reference voltage.

5. A circuit according to claim 2, wherein said reference parameter adjustment circuit is configured to adjust said reference parameter in accordance with a prescribed number of clock signals between transitions in said input signal.

6. A circuit according to claim 2, wherein said pulse duration control circuit includes a first threshold comparator having an input which is defined in accordance with said reference voltage, and wherein said parameter reference circuit is operative to generate a reference voltage in accordance with said duration between successive, opposite-going transitions of said clock signal and changes in state of the output of said first threshold comparator.

7. A circuit according to claim 6, wherein said multivibrator circuit includes a second threshold comparator having an input which is controlled in accordance with said reference voltage, and controlling the duration of said pulse in accordance with said reference voltage.

8. A circuit according to claim 7, wherein respective components of said first threshold comparator have effectively the same geometries as corresponding components of said second threshold comparator.

9. A circuit according to claim 1, wherein said multivibrator circuit is operative to assert a first logic level at said output terminal in response to the assertion of said input signal to said input terminal, and wherein said pulse duration control circuit is operative to cause a second logic level to be asserted at said output terminal of said multivibrator circuit arrangement upon expiration of a period of time subsequent to said first logic level being asserted at said output terminal, said period of time corresponding to said duration between successive, opposite-going transitions of said clock signal.

10. A circuit according to claim 1, wherein said pulse duration control circuit comprises:
 a first comparator circuit that includes a first storage capacitor, coupled in circuit with a first controlled current source and a first threshold detector, said first controlled current source being operative to controllably discharge said first storage capacitor in response to application of said clock signal to said clock input terminal, said first threshold detector being operative to produce an output in response to a voltage across said first capacitor satisfying a prescribed relationship with a reference voltage; and
 a second storage capacitor coupled in circuit with a second controlled current source, which is operative to controllably charge and discharge said second capacitor in accordance with said output produced by said first threshold detector, a voltage across said second capacitor being coupled to said first controlled current source to control the operation of said first controlled current source in discharging said first storage capacitor, and wherein the voltage across said second capacitor is coupled to control the duration of said output pulse produced by said multivibrator circuit.

11. A circuit according to claim 10, wherein said pulse duration control circuit further comprises:
 a second comparator circuit that includes a third storage capacitor, coupled in circuit with a third controlled current source and a second threshold detector, said third controlled current source being operative to controllably discharge said third storage capacitor in accordance with the voltage across said second capacitor, and in response to application of said input signal to said input terminal of said multivibrator circuit, said second threshold detector being operative to produce an output in response to a voltage across said second capacitor satisfying said prescribed relationship with said reference voltage, said output of said second threshold detector being coupled to said control terminal of said multivibrator circuit to control said duration of said output pulse produced by said multivibrator circuit.

12. A circuit according to claim 11, wherein respective components of said first comparator circuit effectively match corresponding components of said second comparator circuit.

13. A circuit according to claim 11, wherein said multivibrator circuit comprises a multivibrator differentiator circuit having an input node to which said input signal is applied, a reset node, and an output node, and a multivibrator circuit having an input node coupled to the output node of said multivibrator differentiator circuit, a reset node coupled to said output of said second threshold detector, a first output node coupled to said output terminal from which said output pulse is produced, and a second, inverted, output node coupled to the reset node of said multivibrator differentiator circuit.

14. A circuit according to claim 11, wherein said pulse duration control circuit further comprises a third multivibrator circuit having an input node to which said clock signal is applied, a reset node coupled to the output of said first threshold detector, and an output node coupled to said first and second controlled current sources.

15. A circuit according to claim 14, wherein said pulse duration control circuit further comprises a combinational logic circuit, which is coupled to the output of said first threshold detector, to the output node of said third multivibrator circuit, and to said clock input terminal, and being operative to control the operation of said second controlled current source in accordance with a logical combination of said clock signal, the output of said first threshold detector, and the output node of said third multivibrator circuit.

16. A circuit according to claim 15, wherein said second controlled current source comprises a first current supply circuit coupled to said second storage capacitor and to said combinational logic circuit, and being operative to supply a charging current to said second storage capacitor in accordance with a first logical output of said combinational logic circuit.

17. A circuit according to claim 16, wherein said combinational logic circuit is operative to cause said first current supply circuit to supply charging current to said second storage capacitor in response to the output of said first threshold detector changing state subsequent to said clock signal undergoing a prescribed change in state.

18. A circuit according to claim 17, wherein said second controlled current source comprises a second current supply circuit coupled to said second storage capacitor and to said combinational logic circuit, and being operative to remove a discharging current from said second storage capacitor in accordance with a second logical output of said combinational logic circuit.

19. A circuit according to claim 18, wherein said combinational logic circuit is operative to cause said second current supply circuit to remove discharging current from said second storage capacitor in accordance with a prescribed logical relationship between said clock signal and the output of said first threshold detector.

20. A circuit according to claim 19, wherein said combinational logic circuit is operative to cause said second current supply circuit to remove discharging current from said second storage capacitor in response to the output of said first threshold detector changing state prior said clock signal undergoing said prescribed change in state.

21. A circuit according to claim 16, wherein said pulse duration control circuit further comprises a combinational logic circuit, which is operative to control the operation of said second controlled current source in accordance with a logical combination of said clock signal and the output of said first threshold detector.

22. A circuit according to claim 21, wherein said combinational logic circuit is operative to control the operation of said second controlled current source such that the charge on said second storage capacitor is adjusted in accordance with the difference in time between a change in state of said clock signal and a change in state of the output of said first threshold detector.

23. A circuit according to claim 22, wherein said first controlled current source is operative to control the operation of said controlled current source such that the charge on said second storage capacitor is adjusted in accordance with the difference in time between a change in state of said first threshold detector and a change in state of the output of said clock signal.

24. A circuit according to claim 1, wherein said pulse duration control circuit comprises a comparator circuit that includes a storage capacitor, coupled in circuit with a controlled current source and a threshold detector, said controlled current source being operative to controllably discharge said storage capacitor in response to application of said clock signal to said clock input terminal, said threshold detector being operative to produce an output in response to a voltage across said capacitor satisfying a prescribed relationship with a reference voltage, said reference voltage being adjusted to cause the output of said threshold detector to change state in accordance with said successive, opposite-going transitions of said clock signal.

25. A circuit for generating a pulse comprising:

an input terminal to which an input signal is applied;

a clock terminal to which a clock signal is applied;

an output terminal from which said pulse is produced;

a multivibrator circuit having an input coupled to said input terminal, and an output coupled to said output terminal, and a control terminal to which a control signal is applied, said a multivibrator circuit being operative to generate said pulse in response to said input signal; and a pulse duration control circuit having a clock input coupled to said clock terminal, and an output coupled to said control terminal of said multivibrator circuit, and being operative to generate said control signal in accordance with the duration between successive, opposite-going transitions of said clock signal; and wherein said multivibrator circuit is operative to establish the duration of said pulse in accordance with the shorter duration of the pulse width of said input signal or the duration between successive, opposite-going transitions of said clock signal.

26. A circuit according to claim 25, wherein said pulse duration control circuit comprises a comparator circuit that includes a storage capacitor, coupled in circuit with a controlled current source and a threshold detector, said controlled current source being operative to controllably discharge said storage capacitor in response to application of said clock signal to said clock input terminal, said threshold detector being operative to produce an output in response to a voltage across said capacitor satisfying a prescribed relationship with a reference voltage, said reference voltage being adjusted to cause the output of said threshold detector to change state in accordance with changes in state of said clock signal.

* * * * *